(12) United States Patent
Wu

(10) Patent No.: US 11,980,019 B2
(45) Date of Patent: May 7, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventor: Han Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 180 days.

(21) Appl. No.: 17/436,127

(22) PCT Filed: Apr. 12, 2021

(86) PCT No.: PCT/CN2021/086461
§ 371 (c)(1),
(2) Date: Sep. 3, 2021

(87) PCT Pub. No.: WO2021/204288
PCT Pub. Date: Oct. 14, 2021

(65) Prior Publication Data
US 2023/0066794 A1 Mar. 2, 2023

(30) Foreign Application Priority Data
Apr. 10, 2020 (CN) .......................... 202010279023.6

(51) Int. Cl.
*H10B 12/00* (2023.01)
(52) U.S. Cl.
CPC ......... *H10B 12/0335* (2023.02); *H10B 12/31* (2023.02)
(58) Field of Classification Search
CPC .... H10B 12/0335; H10B 12/31; H10B 12/30; H10B 12/03; H01L 21/768
See application file for complete search history.

(56) References Cited

U.S. PATENT DOCUMENTS 6,150,272 A 11/2000 Liu et al.
7,615,494 B2 11/2009 Han et al.
(Continued)

FOREIGN PATENT DOCUMENTS

| CN | 101145541 A | 3/2008 |
| CN | 101989591 A | 3/2011 |
| KR | 20030056603 A | 7/2003 |

OTHER PUBLICATIONS

International Search Report cited in PCT/CN2021/086461 dated Jul. 15, 2021, 8 pages.

*Primary Examiner* — Shahed Ahmed
*Assistant Examiner* — Khatib A Rahman
(74) *Attorney, Agent, or Firm* — Cooper Legal Group, LLC

(57) ABSTRACT

The present disclosure relates to the technical field of semiconductor manufacturing, and provides a semiconductor structure and a forming method thereof. The forming method includes: providing a semiconductor substrate, where a surface of the semiconductor substrate is provided with a plurality of conductive structures arranged at intervals; etching a surface of the conductive structure into a curved surface, and then depositing sequentially to form a first protective layer, a second protective layer and a third protective layer; etching the first protective layer, the second protective layer and the third protective layer to form a contact hole exposing the etched curved surface of the conductive structure; and forming a mask layer on a surface of the contact hole.

10 Claims, 3 Drawing Sheets

(56) References Cited

U.S. PATENT DOCUMENTS

| | | | |
|---|---|---|---|
| 2005/0176241 A1* | 8/2005 | Ryu | H01L 21/76885 438/634 |
| 2006/0267199 A1* | 11/2006 | Ikeda | H01L 21/76814 257/E21.627 |
| 2008/0014736 A1 | 1/2008 | Kawakita | |
| 2011/0024907 A1* | 2/2011 | Fujiyama | H01L 21/76819 257/E21.585 |
| 2013/0034957 A1* | 2/2013 | Miyata | H10B 12/482 257/E21.577 |
| 2013/0256901 A1* | 10/2013 | Scheiper | H01L 21/28518 977/890 |
| 2017/0170184 A1 | 6/2017 | Nguyen et al. | |
| 2017/0221833 A1* | 8/2017 | Lu | H01L 21/31144 |
| 2018/0233451 A1* | 8/2018 | Chang | H10B 12/0335 |

* cited by examiner

SEMICONDUCTOR STRUCTURE AND FORMING METHOD THEREOF

CROSS REFERENCE TO RELATED APPLICATION

This patent application claims the benefit and priority of Chinese Patent Application No. 202010279023.6, filed on Apr. 10, 2020 and entitled "SEMICONDUCTOR STRUCTURE AND FORMING METHOD THEREOF", the disclosure of which is incorporated by reference herein in its entirety as part of the present application.

TECHNICAL FIELD

The present disclosure relates to the technical field of semiconductor manufacturing, in particular to a semiconductor structure and a forming method thereof.

BACKGROUND

As a commonly used semiconductor memory in computers, dynamic random access memory (DRAM) is composed of many repeated memory cells. Each memory cell typically includes a capacitor and a transistor. In the transistor, the gate is connected to the word line, the drain is connected to the bit line, and the source is connected to the capacitor. The voltage signal in the word line controls the transistor to turn on or off, and then the data information stored in the capacitor is read through the bit line, or data information is written through the bit line into the capacitor for storage. The capacitor of the DRAM is electrically connected to the landing pad through the bottom electrode thereof and forms an access path with the drain of the transistor.

With the shrinking of the feature size of the semiconductor integrated circuit devices, the requirements for the semiconductor manufacturing technology are becoming increasingly stringent. The contact resistance between the capacitor and the landing pad is excessive, and it may be reduced by increasing the cross-sectional area of the cylindrical capacitor or increasing the area of the landing pad. However, this method imposes extremely high requirements on the process technology, making it hard to control, and it may cause the risk of short circuit between two adjacent capacitors. To reduce the resistance between the capacitor and the landing pad without increasing the size of the cylindrical capacitor, it is necessary to increase the contact area between the capacitor and the landing pad by innovating and optimizing the semiconductor manufacturing process flow. This is a technical problem that needs to be solved urgently.

SUMMARY

The present disclosure provides a method of forming a semiconductor structure. The forming method includes the following steps:

providing a semiconductor substrate, a surface of the semiconductor substrate is provided with a plurality of conductive structures arranged at intervals;

etching surfaces of the conductive structures into curved surfaces, and sequentially forming a first protective layer, a second protective layer and a third protective layer by deposition process;

etching the first protective layer, the second protective layer and the third protective layer to form contact holes exposing the etched curved surfaces of the conductive structures; and forming a mask layer on surfaces of the contact holes.

Correspondingly, the present disclosure further provides a technical solution: a semiconductor structure. The semiconductor structure includes:

a semiconductor substrate, a surface of the semiconductor substrate is provided with a plurality of conductive structures arranged at intervals, and the surface of the semiconductor substrate is formed with contact holes exposing etched curved surfaces of the conductive structures;

the conductive structures, the conductive structures are arranged at intervals on the surface of the semiconductor substrate;

one or more protective layers, the one or more protective layers are deposited on the semiconductor substrate and the etched curved surfaces of the conductive structures;

contact holes, the contact holes are located on the surface of the semiconductor substrate; and a mask layer, the mask layer is formed on a surface of contact holes and the etched curved surfaces of the conductive structures.

DETAILED DESCRIPTION

To make the objectives, technical means and effects of the present disclosure clearer, the present disclosure is described in further detail below with reference to the accompanying drawings. It should be understood that the embodiments described herein are merely a part rather than all of the embodiments of the present disclosure, and are not intended to limit the present disclosure. All other embodiments obtained by those skilled in the art based on the embodiments of the present disclosure without creative efforts should fall within the protection scope of the present disclosure.

Step 1: A semiconductor substrate is provided, where a surface of the semiconductor substrate is provided with a plurality of conductive structures arranged at intervals.

Figure 1:
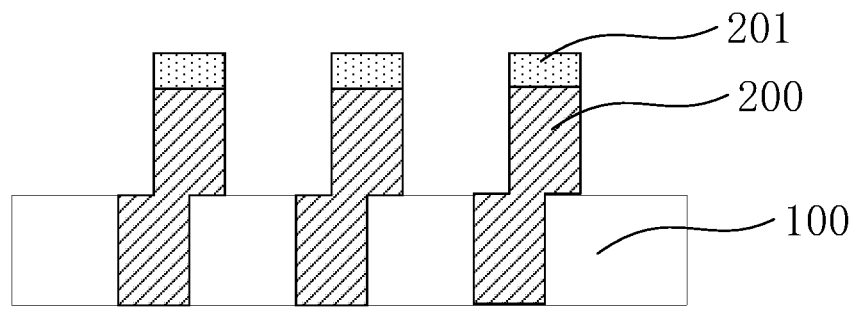
FIGS. 1 to 6 are schematic diagrams of structures obtained by sequentially implementing various steps in a method of forming a semiconductor structure according to an embodiment of the present disclosure.

Referring to FIG. 1, a semiconductor substrate 100 is provided. The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

A surface of the semiconductor substrate 100 is provided with a plurality of conductive structures 200 arranged at intervals. The conductive structure 200 passes through the surface of the semiconductor substrate 100. The conductive structure 200 may be, but is not limited to, made of a conductive material such as tungsten and copper used in an integrated circuit.

A method of forming the conductive structure 200 includes: form a recessed hole in the semiconductor substrate 100, deposit a metal layer (not shown) on the semiconductor substrate 100, and then deposit a mask layer on a surface of the metal layer. The mask layer is patterned to form the conductive structures 200 arranged at intervals on the semiconductor substrate 100, which is defined as main etching in this implementation. Typically, the reaction time of the main etching is about 30-50 s. Through the main etching, a plurality of conductive structures 200 arranged at intervals are formed on the semiconductor substrate 100.

Those skilled in the art may understand that a capacitor of a dynamic random access memory (DRAM) is electrically connected to a landing pad through a bottom electrode thereof and forms an access path with a drain of a transistor. The conductive structure 200 may also be referred to as a landing pad. Further, the conductive structure 200 is located on the surface of the semiconductor substrate 100 and has an offset characteristic. This characteristic ensures that the bottom conductive structure can be connected, and also ensures the close-packed arrangement of capacitors in the top, thereby increasing the capacitor density and increasing the storage capacity of the capacitor per unit area.

Figure 2:
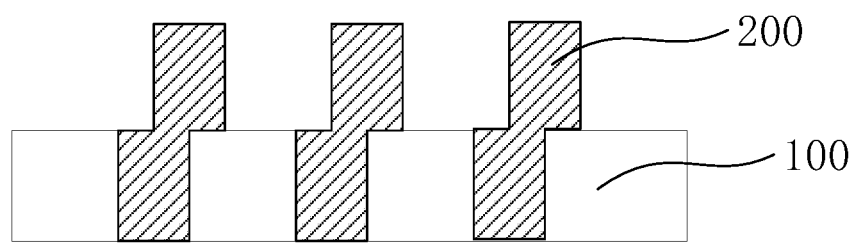

Step 2: Referring to FIG. 2, a shielding layer 201 on a surface of the conductive structure 200 is removed.

Before the method proceeds with the next step, the shielding layer 201 on the surface of the conductive structure 200 is first removed. The shielding layer 201 may include, but is not limited to, oxide, nitride or an impurity. It is necessary to ensure that the conductive structure 200 is pure, so as to control the success rate in the semiconductor manufacturing process flow. The shielding layer 201 on the surface of the conductive structure 200 may be removed by physical polishing and grinding. The shielding layer 201 on the surface of the conductive structure 200 may also be removed by a chemical etching process, that is, wet etching.

Figure 3:
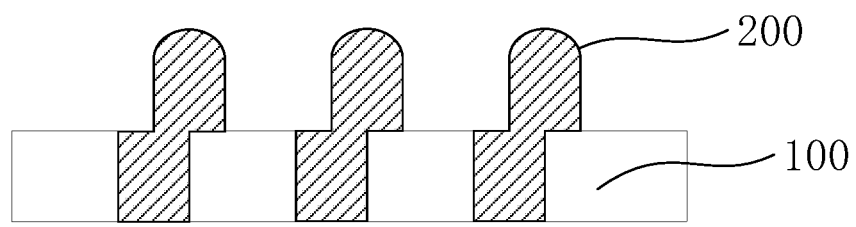

Step 3: Referring to FIG. 3, the surfaces of the conductive structures 200 are etched into curved surfaces by dry etching.

There are two basic etching processes in semiconductor manufacturing, namely dry etching and wet etching. Dry etching is a process that uses a plasma generated by a gas to physically and chemically react with a silicon wafer exposed to the plasma through a masking layer window formed by photolithography so as to etch away a surface material exposed on the silicon wafer. Dry etching is used in fine etching of a small feature size in an advanced circuit. Dry etching uses gas as the main medium, such that the material does not require a liquid chemical for treatment or flushing, and the material enters and exits the system in a dry state. Compared with wet etching, dry etching shows chemical isotropy (etching in both vertical and horizontal directions) and physical anisotropy (single vertical etching).

In this implementation, the surfaces of the conductive structures 200 may be etched by a dry etching process. Specifically, the semiconductor structure is transferred into a reaction chamber, and the pressure in the reaction chamber is reduced by a vacuum system. After a vacuum state is reached, the reaction chamber is filled with a reactive gas. To etch a conductive material such as tungsten and copper used in an integrated circuit, the reactive gas typically uses a mixture of nitrogen fluoride and oxygen. Alternatively, it may also use other fluorine-containing gas as the etching gas, such as carbon tetrafluoride, sulfur hexafluoride or nitrogen trifluoride. A power source creates a radio frequency (RF) field through an electrode in the reaction chamber. The energy field excites the mixed gas into a plasma state. In the excited state, the reactive fluorine etches, and the material is converted into a volatile component and discharged by the vacuum system.

Further, in this implementation, in order to meet the corresponding process requirements, it is specifically necessary to increase the etching time after removing the shielding layer. The main component of the reactive gas used in the over-etching is nitrogen fluoride. A ratio of nitrogen ion to fluoride ion is controlled between 1:2 and 1:3.5. Typically, the time of over-etching is 20-50% that of the main etching. In this way, the surface of the conductive structure 200 is etched into a curved surface. Finally, other etching residues are removed. The etched curved surfaces of the conductive structures 200 protrudes upward, presenting a shape of narrow top and wide bottom.

Those skilled in the art may understand that a capacitor of a DRAM is electrically connected to a landing pad through a bottom electrode thereof and forms an access path with a drain of a transistor. In the structure where the capacitor and the landing pad are electrically connected, the curved surface means an increased contact area between the capacitor and the landing pad, which reduces the resistance between the capacitor and the landing pad.

Therefore, by increasing the contact area between the capacitor and the landing pad, the present disclosure reduces the resistance between the capacitor and the landing pad without increasing the size of the cylindrical capacitor, thereby avoiding the risk of short circuit between two adjacent capacitors. Meanwhile, this implementation satisfies the technical requirements of the semiconductor process and is easy to operate.

Figure 4:
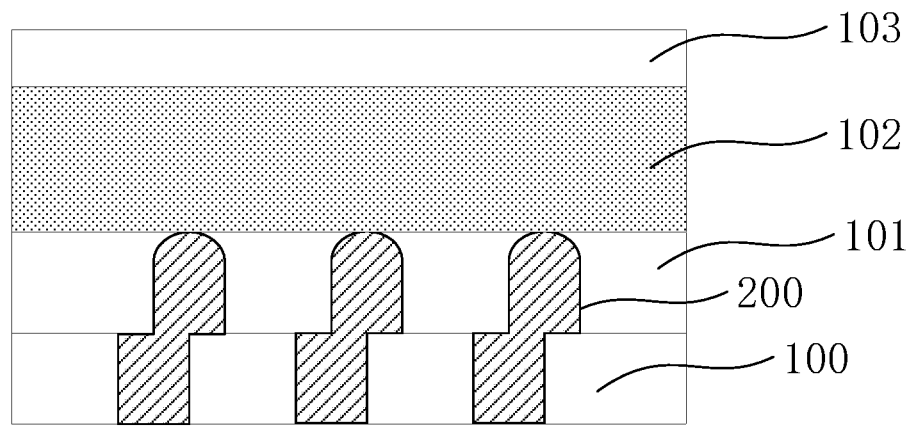

Step 4: Referring to FIG. 4, a protective layer is formed on the surface of the semiconductor substrate 100 and the etched conductive structures 200.

Specifically, after the surfaces of the conductive structures 200 are etched into curved surfaces, a first protective layer 101, a second protective layer 102 and a third protective layer 103 are sequentially forming on the surfaces of the semiconductor substrates 100 and the etched surfaces of the conductive structures 200 by deposition process.

There are essentially two thin film deposition processes: chemical vapor deposition (CVD) and physical vapor deposition (PVD). CVD is a growth technology in which one or several substances in a gaseous state are activated in a certain way and undergo a chemical reaction on the surface of a substrate to deposit a desired solid thin film. PVD is a technology that uses a certain physical process to transfer a substance, that is, to transfer atoms or molecules to the surface of a silicon substrate and deposit them into a thin film. Thin film deposition processes further include spin coating and electroplating, etc. In this implementation, the specific deposition process of the first protective layer 101 may vary. For example, the CVD process may be used to deposit a protective layer 101 with a predetermined thickness distribution on the surfaces of the semiconductor substrates 100 and the etched surface of the conductive structure 200. Further, the control means for controlling the flow velocity of the introduced gas flow, controlling the flow rate of the introduced gas flow, controlling the deposition time or controlling the deposition temperature may be used alone. By improving the control accuracy of the gas flow and temperature, it can ensure that all atoms are arranged neatly during deposition to form a monocrystalline layer. Finally, a first protective layer 101 with a uniform thickness is formed on the surfaces of the semiconductor substrates 100 and the etched surface of the conductive structure 200. By means of the same deposition process, the second protective layer 102 is deposited on a surface of the first protective layer 101, and the third protective layer 103 is deposited on a surface of the second protective layer 102.

Commonly used deposition materials include monocrystalline silicon, polycrystalline silicon, silicon dioxide, silicon nitride and other insulating materials used for isolation and interconnection layers. Therefore, the materials of the first protective layer 101, the second protective layer 102 and the third protective layer 103 may include, but are not limited to, silicon dioxide, silicon nitride, silicon oxynitride, polycrystalline silicon, monocrystalline silicon, carbon and other insulating materials used in an integrated circuit. For example, in this implementation, the first protective layer 101 may be a silicon nitride layer, the second protective layer 102 may be an oxide layer, and the third protective layer 103 may be a silicon nitride layer. In addition, according to material properties, the deposition thickness of the protective layer may be 30-120 nm (oxide layer) and 30-50 nm (silicon nitride layer).

Figure 5:
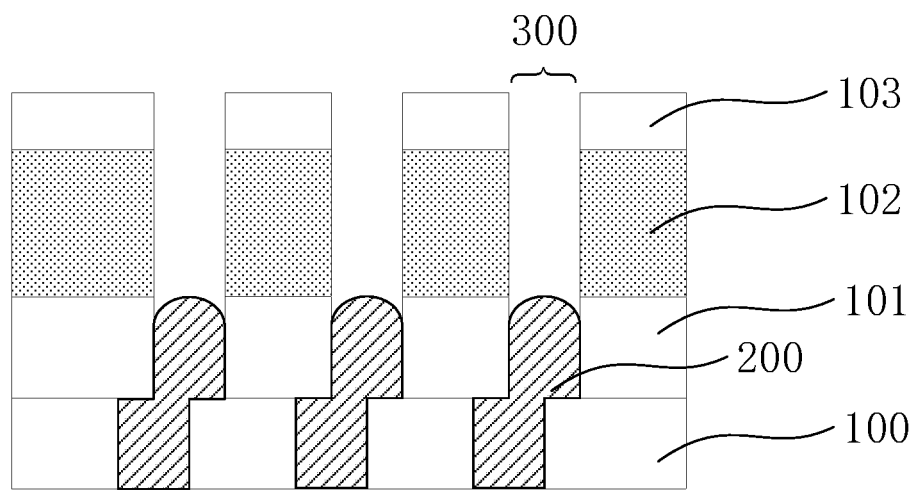

Step 5: Referring to FIG. 5, a semiconductor structure with a contact hole structure is formed by means of an etching process. The method of forming a semiconductor structure is used to form a structure with a landing pad.

Specifically, the first protective layer 101, the second protective layer 102, and the third protective layer 103 are etched to form contact holes 300 exposing the etched curved surfaces of the conductive structures 200, and the surfaces of the conductive structures 200 are etched into curved surfaces by dry etching.

In this implementation, the surfaces of the conductive structures 200 may be etched by a dry etching process. Specifically, the semiconductor structure is transferred into a reaction chamber, and the pressure in the reaction chamber is reduced by a vacuum system. After a vacuum state is reached, the reaction chamber is filled with a reactive gas. To etch a conductive material such as tungsten and copper used in an integrated circuit, the reactive gas typically uses a mixture of nitrogen fluoride and oxygen. Alternatively, it may also use other fluorine-containing gas as the etching gas, such as carbon tetrafluoride, sulfur hexafluoride or nitrogen trifluoride. A power source creates an RF field through an electrode in the reaction chamber. The energy field excites the mixed gas into a plasma state. In the excited state, the reactive fluorine etches, and the material is converted into a volatile component and discharged by a vacuum system.

Further, in this implementation, the main component of the reactive gas used is carbon fluoride. A ratio of carbon ion to fluoride ion is controlled between 1:1 and 1:2. The etching ratio between 1:1 and 1:2 can increase the difference between the etching ratios selected for the first protective layer 101 and the conductive structure 200, avoiding the etching of the conductive structure 200 during the removal of the protective layer 101 and affecting the shape of the conductive structure 200. If the ratio of the etching gas is greater than or not less than this ratio, the contact surface of the conductive structure 200 may be formed into a concave or planar structure. Finally, other etching residues are removed to form the contact hole 300 exposing the etched curved surface of the conductive structure 200.

Figure 6:
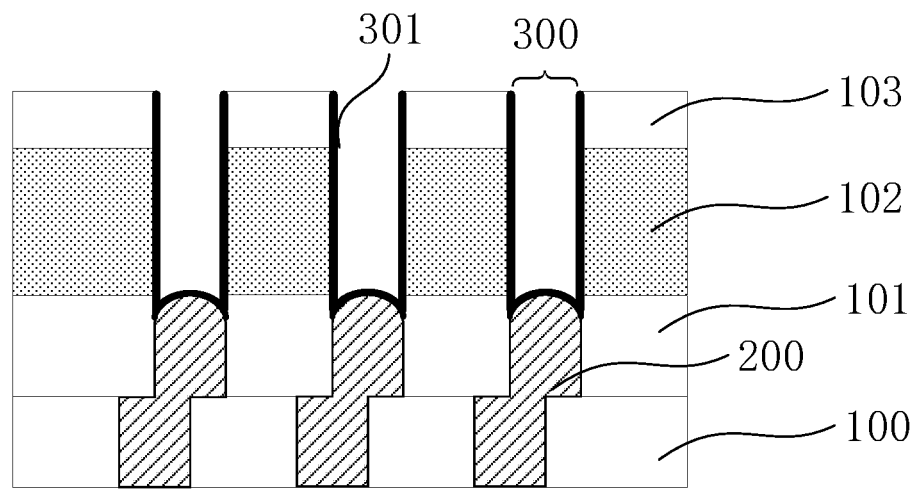

Step 6: Referring to FIG. 6, a mask layer 301 is formed on surfaces of the contact holes 300 and the etched curved surfaces of the conductive structures 200.

Specifically, a mask layer 301 is formed into the contact holes 300, and the contact holes 300 communicate with the etched curved surfaces of the conductive structures 200. In this implementation, the mask layer 301 is formed on the surfaces of the contact holes 300 and the etched curved surfaces of the conductive structures 200 by means of electrochemical plating (ECP). The material of mask layer 301 includes titanium nitride. According to material properties, the thickness of the mask layer 301 may be 30-50 nm (titanium nitride layer).

The capacitor of a DRAM is electrically connected to a landing pad through a bottom electrode thereof and forms an access path with a drain of a transistor. In the structure where the capacitor and the landing pad are electrically connected, the curved surface means an increased contact area between the capacitor and the landing pad, which reduces the resistance between the capacitor and the landing pad.

Therefore, this implementation innovates and optimizes the semiconductor manufacturing process flow to optimize the connection shape of the capacitor, so as to increase the contact area and reduce the contact resistance of the capacitor. It avoids the risk of short circuit between two adjacent capacitors, thereby improving the yield of the semiconductor structure in the semiconductor manufacturing process.

An embodiment of the present disclosure further provides a semiconductor structure.

Figure 7:
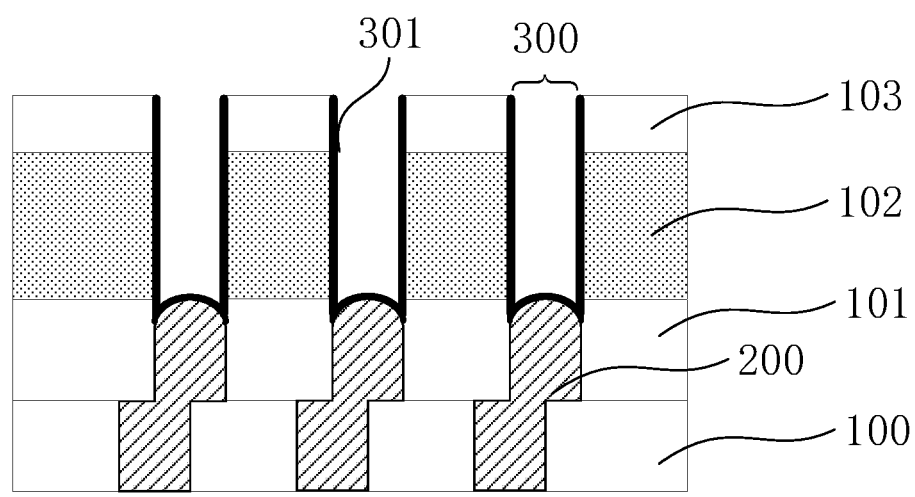
FIG. 7 is a cross-sectional view of a semiconductor structure according to an embodiment of the present disclosure.

FIG. 7 is a cross-sectional view of the semiconductor structure according to an embodiment of the present disclosure.

The semiconductor structure includes a semiconductor substrate 100, conductive structure contact holes 300, a first protective layer 101, a second protective layer 102, a third protective layer 103 and a mask layer 301. The semiconductor structure is a structure with landing pads, which are formed by the above method of forming a semiconductor structure.

The semiconductor substrate 100 may include, but is not limited to, a monocrystalline silicon substrate, a polycrystalline silicon substrate, a gallium nitride substrate or a sapphire substrate. In addition, when the semiconductor substrate 100 is a monocrystalline substrate or a polycrystalline substrate, it may also be an intrinsic silicon substrate or a doped silicon substrate. Further, it may be an N-type polycrystalline silicon substrate or a P-type polycrystalline silicon substrate.

A surface of the semiconductor substrate 100 is provided with a plurality of conductive structures 200 arranged at intervals. The conductive structure 200 passes through the surface of the semiconductor substrate 100. The conductive structure 200 may be, but is not limited to, made of a conductive material such as tungsten and copper used in an integrated circuit. Those skilled in the art may understand that a capacitor of a DRAM is electrically connected to a landing pad through a bottom electrode thereof and forms an access path with a drain of a transistor. The conductive structure 200 may also be referred to as a landing pad. Further, the conductive structure 200 is located on the surface of the semiconductor substrate 100 and has an offset characteristic. This characteristic ensures that the bottom conductive structure can be connected, and also ensures the close-packed arrangement of capacitors in the top, thereby increasing the capacitor density and increasing the storage capacity of the capacitor per unit area.

The first protective layer 101, the second protective layer 102 and the third protective layer 103 are sequentially deposited on the semiconductor substrate 100 and an etched curved surfaces of the conductive structures 200. Commonly used deposition materials include monocrystalline silicon, polycrystalline silicon, silicon dioxide, silicon nitride and other insulating materials used for isolation and interconnection layers. Therefore, the materials of the first protective layer 101, the second protective layer 102 and the third protective layer 103 may include, but are not limited to, silicon dioxide, silicon nitride, silicon oxynitride, polycrystalline silicon, monocrystalline silicon, carbon and other insulating materials used in an integrated circuit. For example, in this implementation, the first protective layer 101 may be a silicon nitride layer, the second protective layer 102 may be an oxide layer, and the third protective layer 103 may be a silicon nitride layer. In addition, according to material properties, the deposition thickness of the protective layer may be 30-120 nm (oxide layer) and 30-50 nm (silicon nitride layer).

The etched curved surfaces of the conductive structures 200 protrudes upward, presenting a shape that is narrow top and wide bottom. The contact hole 300 is located on the surface of the semiconductor substrate 100.

The mask layer 301 is formed on surfaces of the contact holes 300 and the etched curved surfaces of the conductive structures 200. Specifically, a mask layer 301 is formed into the contact holes 300, and the contact holes 300 communicate with the etched curved surfaces of the conductive structures 200. The material of mask layer includes titanium nitride. According to material properties, the thickness of the mask layer 301 may be 30-50 nm (titanium nitride layer).

The capacitor of a DRAM is electrically connected to a landing pad through a bottom electrode thereof and forms an access path with a drain of a transistor. In the structure where the capacitor and the landing pad are electrically connected, the curved surface means an increased contact area between the capacitor and the landing pad, which reduces the resistance between the capacitor and the landing pad. Therefore, by increasing the contact area between the capacitor and the landing pad, the present disclosure reduces the resistance between the capacitor and the landing pad without increasing the size of the cylindrical capacitor, thereby avoiding the risk of short circuit between two adjacent capacitors. Meanwhile, this implementation satisfies the technical requirements of the semiconductor process and is easy to operate.

The above described are merely preferred implementations of the present disclosure. It should be noted that several improvements and replacements may further be made by those of ordinary skill in the art without departing from the principle of the present disclosure, but such improvements and replacements should also be deemed as falling within the protection scope of the present disclosure.

What is claimed is:

1. A method of forming a semiconductor structure, comprising:
   providing a semiconductor substrate, a surface of the semiconductor substrate is provided with a plurality of conductive structures arranged at intervals;
   etching surfaces of the conductive structures into curved surfaces, and sequentially forming one or more protective layers on the semiconductor substrate;
   etching the one or more protective layers to form contact holes exposing the etched curved surfaces of the conductive structures, the contact holes being located on the surface of the semiconductor substrate; and
   forming a mask layer on surfaces of the contact holes and the etched curved surfaces of the conductive structures;
   wherein the etching surfaces of the conductive structures into curved surfaces comprises: removing a shielding layer on the surfaces of the conductive structures, and etching the surfaces of the conductive structures into the curved surfaces after removing the shielding layer.

2. The method of forming a semiconductor structure according to claim 1, wherein the etched curved surfaces of the conductive structures protrude upward, presenting a shape of narrow top and wide bottom.

3. The method of forming a semiconductor structure according to claim 1, wherein a material of the one or more protective layers includes at least one of silicon oxide, silicon nitride, monocrystalline silicon or polycrystalline silicon.

4. The method of forming a semiconductor structure according to claim 1, wherein a material of the mask layer includes titanium nitride.

5. The method of forming a semiconductor structure according to claim 1, wherein the etching surfaces of the conductive structures into curved surfaces comprises: performing a dry etching process.

6. The method of forming a semiconductor structure according to claim 5, wherein the etching surfaces of the conductive structures into curved surfaces comprises: performing an over-etching process, and performing the dry etching process after performing the over-etching process.

7. The method of forming a semiconductor structure according to claim 6, wherein a reactive gas in the over-etching process is nitrogen fluoride, and a ratio of nitrogen ion to fluoride ion is between 1:2 and 1:3.5.

8. The method of forming a semiconductor structure according to claim 1, wherein the etching the one or more protective layers comprises etching the one or more protective layers by a dry etching process.

9. The method of forming a semiconductor structure according to claim 8, wherein a reactive gas for the dry etching process comprises carbon fluoride.

10. The method of forming a semiconductor structure according to claim 9, wherein a ratio of carbon ion to fluoride ion in the carbon fluoride is between 1:1 and 1:2.

* * * * *